United States Patent
Lu et al.

(10) Patent No.: US 9,786,610 B2
(45) Date of Patent: Oct. 10, 2017

(54) SEMICONDUCTOR PACKAGE AND FABRICATION METHOD THEREOF

(71) Applicant: Siliconware Precision Industries Co., Ltd., Taichung (TW)

(72) Inventors: Hui-Chuan Lu, Taichung (TW); Chun-Hung Lu, Taichung (TW); Po-Yi Wu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 36 days.

(21) Appl. No.: 14/824,570

(22) Filed: Aug. 12, 2015

(65) Prior Publication Data

US 2016/0141255 A1    May 19, 2016

(30) Foreign Application Priority Data

Nov. 18, 2014 (TW) .............................. 103139871 A

(51) Int. Cl.
*H01L 23/48* (2006.01)
*H01L 23/00* (2006.01)
(Continued)

(52) U.S. Cl.
CPC ........ *H01L 23/562* (2013.01); *H01L 21/4857* (2013.01); *H01L 23/147* (2013.01); *H01L 23/16* (2013.01); *H01L 23/3128* (2013.01); *H01L 23/49822* (2013.01); *H01L 23/49827* (2013.01); *H01L 23/49866* (2013.01); *H01L 23/5383* (2013.01); *H01L 2224/16225* (2013.01); *H01L 2224/32225* (2013.01);
(Continued)

(58) Field of Classification Search
CPC .............. H01L 23/562; H01L 23/5383; H01L 23/49866; H01L 23/49827; H01L 23/49822; H01L 23/147; H01L 23/3128; H01L 23/16
See application file for complete search history.

(56) References Cited

U.S. PATENT DOCUMENTS

| | | | |
|---|---|---|---|
| 2009/0141464 A1* | 6/2009 | Taguchi | H01L 23/49822 361/760 |
| 2009/0145636 A1* | 6/2009 | Miki | H01L 21/6835 174/255 |

(Continued)

*Primary Examiner* — Trung Q Dang
(74) *Attorney, Agent, or Firm* — Mintz Levin Cohn Ferris Glovsky and Popeo, P.C.; Peter F. Corless; Steven M. Jensen

(57) ABSTRACT

A semiconductor package is provided, which includes: a circuit structure having a first bottom surface and a first top surface opposite to the first bottom surface; at least a semiconductor element disposed on the first top surface of the circuit structure and electrically connected to the circuit structure; an encapsulant formed on the first top surface of the circuit structure to encapsulate the semiconductor element, wherein the encapsulant has a second bottom surface facing the first top surface of the circuit structure and a second top surface opposite to the second bottom surface; and a strengthening layer formed on the second top surface of the encapsulant, or formed between the circuit structure and the encapsulant, or formed on the first bottom surface of the circuit structure, thereby effectively preventing the encapsulant from warping and the semiconductor element from cracking.

12 Claims, 12 Drawing Sheets

(51) Int. Cl.
  *H01L 23/498* (2006.01)
  *H01L 23/16* (2006.01)
  *H01L 23/31* (2006.01)
  *H01L 23/14* (2006.01)
  *H01L 21/48* (2006.01)
  *H01L 23/538* (2006.01)

(52) U.S. Cl.
  CPC .............. *H01L 2224/73204* (2013.01); *H01L 2924/15311* (2013.01); *H01L 2924/181* (2013.01)

(56) References Cited

U.S. PATENT DOCUMENTS

| | | | | |
|---|---|---|---|---|
| 2011/0233765 | A1* | 9/2011 | Tani | H01L 24/03 257/737 |
| 2012/0313243 | A1* | 12/2012 | Chang | H01L 24/19 257/738 |
| 2013/0168850 | A1* | 7/2013 | Samoilov | H01L 21/76898 257/737 |

* cited by examiner

SEMICONDUCTOR PACKAGE AND FABRICATION METHOD THEREOF

CROSS-REFERENCES TO RELATED APPLICATIONS

This application claims under 35 U.S.C. §119(a) the benefit of Taiwanese Application No. 103139871, filed Nov. 18, 2014, the entire contents of which are incorporated herein by reference

BACKGROUND OF THE INVENTION

1. Field of the Invention

The present invention relates to semiconductor packages and fabrication methods thereof, and more particularly, to a semiconductor package having a strengthening layer and a fabrication method thereof.

2. Description of Related Art

Flip-chip technologies facilitate to reduce chip packaging sizes and shorten signal transmission paths and therefore have been widely used for chip packaging. Various types of packages such as chip scale packages (CSPs), direct chip attached (DCA) packages and multi-chip module (MCM) packages can be achieved through flip-chip technologies.

In a flip-chip packaging process, a big CTE (Coefficient of Thermal Expansion) mismatch between a chip and a substrate adversely affects the formation of joints between conductive bumps of the chip and corresponding contacts of the substrate and easily causes delamination of the conductive bumps from the substrate.

Further, along with increased integration of integrated circuits, the CTE mismatch between the chip and the substrate induces more thermal stresses and leads to more serious warpage, thereby reducing the reliability of electrical connection between the chip and the substrate and resulting in failure of a reliability test.

Accordingly, a silicon interposer is provided between the substrate and the chip. Since the silicon interposer is close in material to the chip, the above-described drawbacks caused by a CTE mismatch can be effectively overcome.

FIG. 1 is a schematic cross-sectional view of a conventional semiconductor package 1 having a silicon interposer. Referring to FIG. 1, the semiconductor package 1 has a substrate 10; a silicon interposer 11 disposed on the substrate 10 through a plurality of solder balls 12; a UBM (Under Bump Metallurgy) layer 13 formed on the silicon interposer 11; and a chip 14 disposed on the silicon interposer 11 through a plurality of solder balls 15.

The substrate 10 has a first surface 10a having a plurality of bonding pads 101 and a second surface 10b opposite to the first surface 10a and having a plurality of bonding pads 102.

The silicon interposer 11 has a bottom surface 11a and an opposite top surface 11b. Further, the silicon interposer 11 has a first circuit layer 111 formed on the bottom surface 11a, a second circuit layer 112 formed on the top surface 11b, and a plurality of through silicon vias (TSVs) 113 penetrating the bottom surface 11a and the top surface 11b and electrically connecting the first circuit layer 111 and the second circuit layer 112. Furthermore, a first insulating layer 114 is formed on the bottom surface 11a and the first circuit layer 111 and a second insulating layer 115 is formed on the top surface 11b and the second circuit layer 112.

The silicon interposer 11 is disposed on the substrate 10 with the solder balls 12 electrically connecting the substrate 10 and the first circuit layer 111. The UBM layer 13 is formed on the second circuit layer 112. The chip 14 has a plurality of bonding pads 141 that are electrically connected to the second circuit layer 112 through the solder balls 15 and the UBM layer 13.

The semiconductor package 1 overcomes the above-described drawbacks and has a reduced size. For example, a substrate generally has a minimum line width/pitch of 12/12 um. When the I/O count of a semiconductor chip increases, since the line width/pitch of the substrate cannot be reduced, the area of the substrate must be increased such that more traces can be formed on the substrate and electrically connected to the semiconductor chip having high I/O count. On the other hand, referring to FIG. 1, the chip 14 is disposed on the silicon interposer 11 having TSVs 113 and electrically connected to the substrate 10 through the silicon interposer 11. Through a semiconductor process, the silicon interposer 11 can have a line width/pitch of 3/3 um or less. Therefore, the area of the silicon interposer 11 is sufficient for electrical connection with the chip 14 having high I/O count and hence the area of the substrate 10 does not need to be increased. Further, the fine line width/pitch of the silicon interposer 11 facilitates to shorten the electrical transmission path. Therefore, the semiconductor chip 14 disposed on the silicon interposer 11 achieves a higher electrical transmission speed than if being directly disposed on the substrate 10.

However, the semiconductor package 1 having the silicon interposer 11 has a high fabrication cost. Accordingly, Si substrate interconnection technology has been developed to fabricate packages that do not include silicon interposers and have a size less than the semiconductor package 1.

FIGS. 2A to 2E are schematic cross-sectional views showing a semiconductor package 2 and a fabrication method thereof according to the prior art.

Referring to FIG. 2A, a carrier 20 and a circuit structure 21 are provided. The carrier 20 has a first surface 20a and a second surface 20b opposite to the first surface 20a. The circuit structure 21 has a first bottom surface 21a and a first top surface 21b opposite to the first bottom surface 21a. The circuit structure 21 has at least a dielectric layer 211, a plurality of conductive vias 212 formed in the dielectric layer 211, and at least a circuit layer 213 and a plurality of conductive pads 214 formed on the dielectric layer 211. Further, a first insulating layer 22 is formed on the first bottom surface 21a and a second insulating layer 23 is formed on the first top surface 21b. The carrier 20 is disposed on the first insulating layer 22 via the second surface 20b thereof, and a UBM layer 24 is formed on the conductive pads 214.

Referring to FIG. 2B, at least a chip 25 is provided, which has an active surface 25a with a plurality of bonding pads 251 and an inactive surface 25b opposite to the active surface 25a. The chip 25 is disposed on the UBM layer 24 through a plurality of solder balls 26.

Referring to FIG. 2C, an underfill 27 is formed between the chip 25 and the second insulating layer 23.

Referring to FIG. 2D, an encapsulant 28 is formed on the second insulating layer 23. The encapsulant 28 has a second bottom surface 28a and a second top surface 28b opposite to the second bottom surface 28a.

Referring to FIG. 2E, the encapsulant 28 is thinned from the second top surface 28b thereof by mechanical grinding. Then, subsequent process such as thinning and etching of the carrier 20 can be performed.

In the above-described method of the semiconductor package 2, the encapsulant 28 is thinned to reduce warping of the encapsulant 28 caused by a big CTE mismatch between the encapsulant 28 (or underfill 27) and the chip 25.

Even further, the inactive surface 25b of the chip 25 can be exposed from the encapsulant 28 to improve the heat dissipating effect. However, the thinning process cannot effectively reduce warping of the encapsulant 28. Consequently, cracking of the chip 25 easily occurs.

Therefore, there is a need to provide a semiconductor package and a fabrication method thereof so as to overcome the above-described drawbacks.

SUMMARY OF THE INVENTION

In view of the above-described drawbacks, the present invention provides a semiconductor package, which comprises: a circuit structure having a first bottom surface and a first top surface opposite to the first bottom surface; at least a semiconductor element disposed on the first top surface of the circuit structure and electrically connected to the circuit structure; an encapsulant formed on the first top surface of the circuit structure to encapsulate the semiconductor element, wherein the encapsulant has a second bottom surface facing the first top surface of the circuit structure and a second top surface opposite to the second bottom surface; and a strengthening layer formed on the second top surface of the encapsulant, or formed between the circuit structure and the encapsulant, or formed on the first bottom surface of the circuit structure.

If the strengthening layer is formed on the second top surface of the encapsulant or formed between the circuit structure and the encapsulant, the semiconductor package can further comprise a first insulating layer formed on the first bottom surface of the circuit structure and having a plurality of first through holes for exposing a plurality of conductive vias of the circuit structure. The package can further comprise a plurality of second conductive pads formed on the first insulating layer and in the first through holes and electrically connected to the conductive vias of the circuit structure.

If the strengthening layer is formed on the second top surface of the encapsulant, the semiconductor package can further comprise an insulating layer formed on the strengthening layer. The package can further comprise an adhesive layer formed between the encapsulant and the strengthening layer.

If the strengthening layer is formed between the circuit structure and the encapsulant, the strengthening layer can have a plurality of openings for exposing a plurality of first conductive pads of the circuit structure.

If the strengthening layer is formed on the first bottom surface of the circuit structure, the semiconductor package can further comprise a first insulating layer formed between the circuit structure and the strengthening layer, and a plurality of second through holes penetrating the strengthening layer and the first insulating layer and exposing a plurality of conductive vias of the circuit structure. The package can further comprise an insulating layer formed on the strengthening layer and wall surfaces of the second through holes. The package can further comprise a plurality of second conductive pads formed on the insulating layer and in the second through holes and electrically connected to the conductive vias of the circuit structure.

The package can further comprise a second insulating layer formed on the first top surface of the circuit structure and exposing a plurality of first conductive pads of the circuit structure.

The package can further comprise a UBM (Under Bump Metallurgy) layer formed on a plurality of first conductive pads of the circuit structure, and a plurality of conductive elements formed between the semiconductor element and the UBM layer.

The package can further comprise an underfill formed on an active surface of the semiconductor element for encapsulating the UBM layer and the conductive elements.

The present invention further provides a method for fabricating a semiconductor package, which comprises the steps of: providing a circuit structure having a first bottom surface and a first top surface opposite to the first bottom surface; disposing at least a semiconductor element on the first top surface of the circuit structure, wherein the semiconductor element is electrically connected to the circuit structure; forming an encapsulant on the first top surface of the circuit structure to encapsulate the semiconductor element, wherein the encapsulant has a second bottom surface facing the first top surface of the circuit structure and a second top surface opposite to the second bottom surface; thinning the encapsulant from the second top surface thereof; and forming a strengthening layer on the second top surface of the encapsulant.

The above-described method can further comprise: forming a first insulating layer on the first bottom surface of the circuit structure; disposing a carrier on the first insulating layer, wherein the carrier has a first surface and a second surface opposite to the first surface and facing the first insulating layer; after thinning the encapsulant, thinning the carrier from the first surface thereof; removing the remaining portion of the carrier by etching so as to expose the first insulating layer; forming a plurality of first through holes in the first insulating layer to expose a plurality of conductive vias of the circuit structure; and forming on the first insulating layer and in the first through holes a plurality of second conductive pads that are electrically connected to the conductive vias of the circuit structure.

The above-described method can further comprise: forming an insulating layer on the strengthening layer; and forming an adhesive layer between the encapsulant and the strengthening layer.

The present invention provides another method for fabricating a semiconductor package, which comprises the steps of: providing a circuit structure having a first bottom surface and a first top surface opposite to the first bottom surface; forming a strengthening layer on the first top surface of the circuit structure; disposing at least a semiconductor element on the strengthening layer, wherein the semiconductor element is electrically connected to the circuit structure; forming an encapsulant on the strengthening layer to encapsulate the semiconductor element, wherein the encapsulant has a second bottom surface facing the strengthening layer and a second top surface opposite to the second bottom surface; and thinning the encapsulant from the second top surface thereof.

The above-described method can further comprise: forming a first insulating layer on the first bottom surface of the circuit structure; disposing a carrier on the first insulating layer, wherein the carrier has a first surface and a second surface opposite to the first surface and facing the first insulating layer; after thinning the encapsulant, thinning the carrier from the first surface thereof; removing the remaining portion of the carrier by etching so as to expose the first insulating layer; forming a plurality of first through holes in the first insulating layer to expose a plurality of conductive vias of the circuit structure; and forming on the first insulating layer and in the first through holes a plurality of second conductive pads that are electrically connected to the conductive vias of the circuit structure.

In the above-described method, the strengthening layer can have a plurality of openings for exposing a plurality of first conductive pads of the circuit structure.

The present invention provides a further method for fabricating a semiconductor package, which comprises the steps of: providing a circuit structure having a first bottom surface and a first top surface opposite to the first bottom surface; disposing at least a semiconductor element on the first top surface of the circuit structure, wherein the semiconductor element is electrically connected to the circuit structure; forming an encapsulant on the first top surface of the circuit structure to encapsulate the semiconductor element, wherein the encapsulant has a second bottom surface facing the first top surface of the circuit structure and a second top surface opposite to the second bottom surface; thinning the encapsulant from the second top surface thereof; and forming a strengthening layer on the first bottom surface of the circuit structure.

In the above-described method, forming the strengthening layer can comprise: forming a first insulating layer on the first bottom surface of the circuit structure; disposing a carrier on the first insulating layer, wherein the carrier has a first surface and a second surface opposite to the first surface and facing the first insulating layer; and after thinning the encapsulant, thinning the carrier from the first surface thereof so as to use the remaining portion of the carrier as the strengthening layer.

Before thinning the encapsulant, the above-described method can further comprise forming an etch stop layer in the carrier at a predetermined depth, allowing the carrier to be thinned according to the etch stop layer; forming a plurality of second through holes penetrating the strengthening layer and the first insulating layer and exposing a plurality of conductive vias of the circuit structure; forming an insulating layer on the strengthening layer and wall surfaces of the second through holes; and forming a plurality of second conductive pads on the insulating layer and in the second through holes and electrically connected to the conductive vias of the circuit structure.

The above-described three methods can further comprise forming a second insulating layer on the first top surface of the circuit structure, wherein a plurality of first conductive pads of the circuit structure are exposed from the second insulating layer; forming a UBM layer on the first conductive pads of the circuit structure; forming a plurality of conductive elements between the semiconductor element and the UBM layer; and forming an underfill on an active surface of the semiconductor element to encapsulate the UBM layer and the conductive elements.

In the above-described package and methods, the circuit structure can comprise at least a dielectric layer, a plurality of conductive vias formed in the dielectric layer, and at least a circuit layer formed on the dielectric layer and electrically connected to the conductive vias, and the circuit layer has a plurality of first conductive pads.

The strengthening layer can be made of an elastic material, a buffer material or a semiconductor material. If the strengthening layer is formed on the second top surface of the encapsulant or formed on the first bottom surface of the circuit structure, the strengthening layer can be made of silicon. If the strengthening layer is formed between the circuit structure and the encapsulant, the strengthening layer can be made of polybenzoxazole (PBO).

According to the present invention, a strengthening layer is formed on the second top surface of the encapsulant, or between the circuit structure and the encapsulant, or on the first bottom surface of the circuit structure. As such, if there is a big CTE mismatch between the encapsulant (or underfill) and the semiconductor element and the encapsulant needs to be thinned, the strengthening layer can alleviate the stress of the encapsulant (or underfill) and effectively reduce warping of the encapsulant and cracking of the semiconductor element, thereby improving the reliability of the semiconductor package.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "top", "bottom", "on", "a" etc. are merely for illustrative purposes and should not be construed to limit the scope of the present invention.

FIGS. 3A to 3I are schematic cross-sectional views showing a semiconductor package 3a and a fabrication method thereof according to a first embodiment of the present invention.

Figure 1:
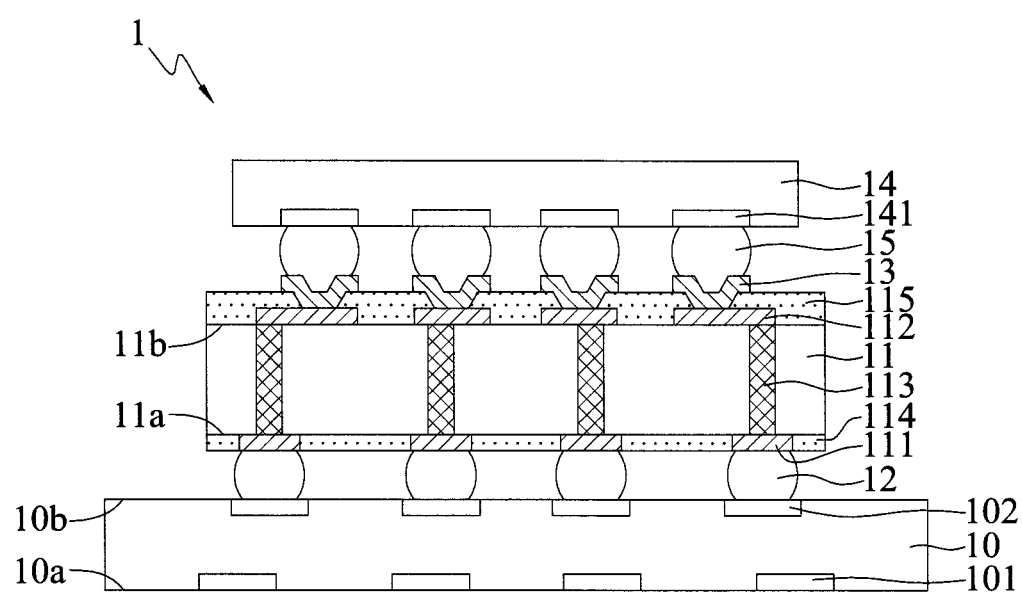
FIG. 1 is a schematic cross-sectional view of a conventional semiconductor package.
Figure 2A:
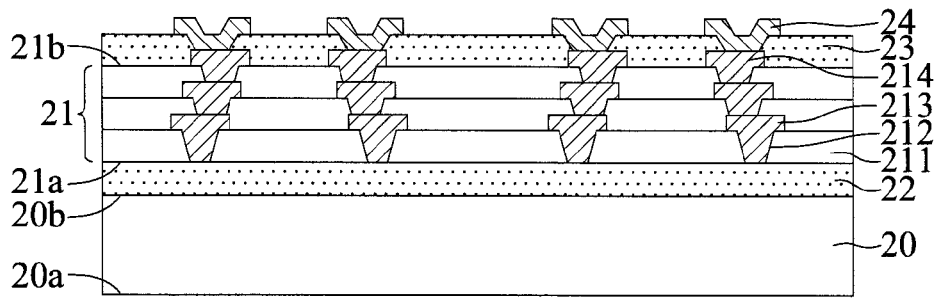
FIGS. 2A to 2E are schematic cross-sectional views showing another semiconductor package and a fabrication method thereof according to the prior art.
Figure 2B:
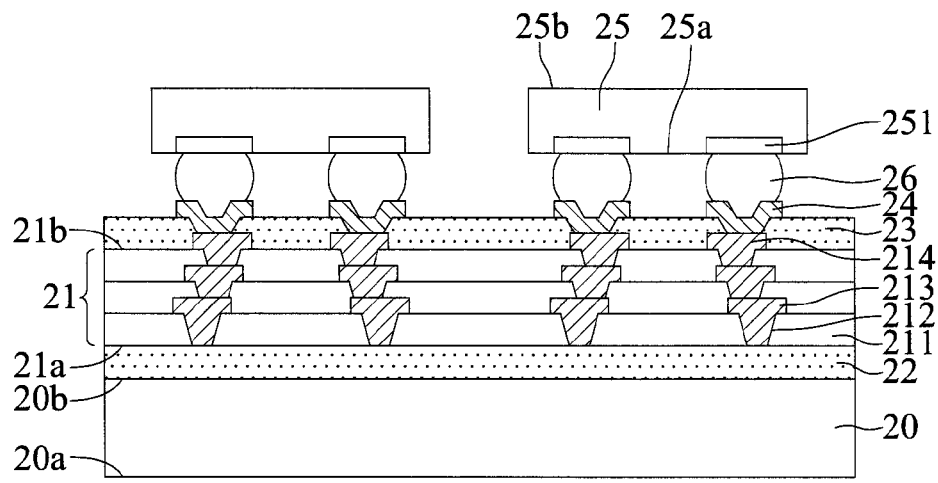
Figure 2C:
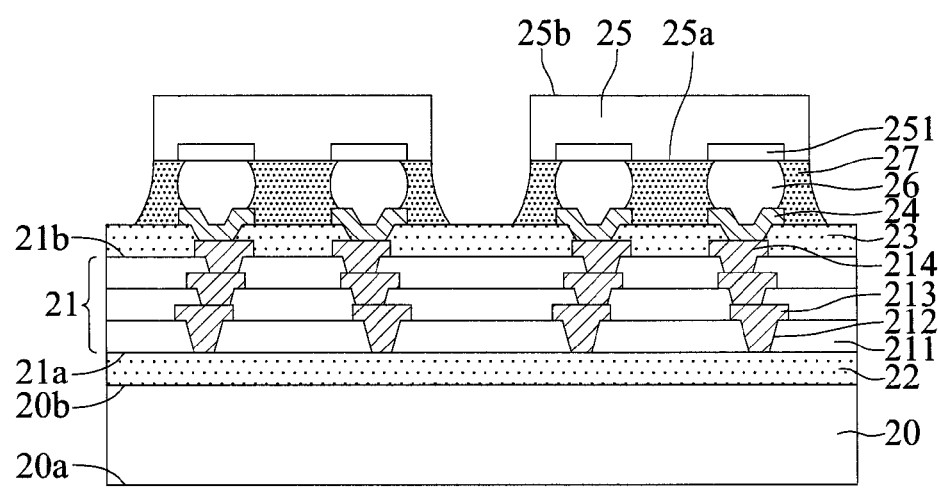
Figure 2D:
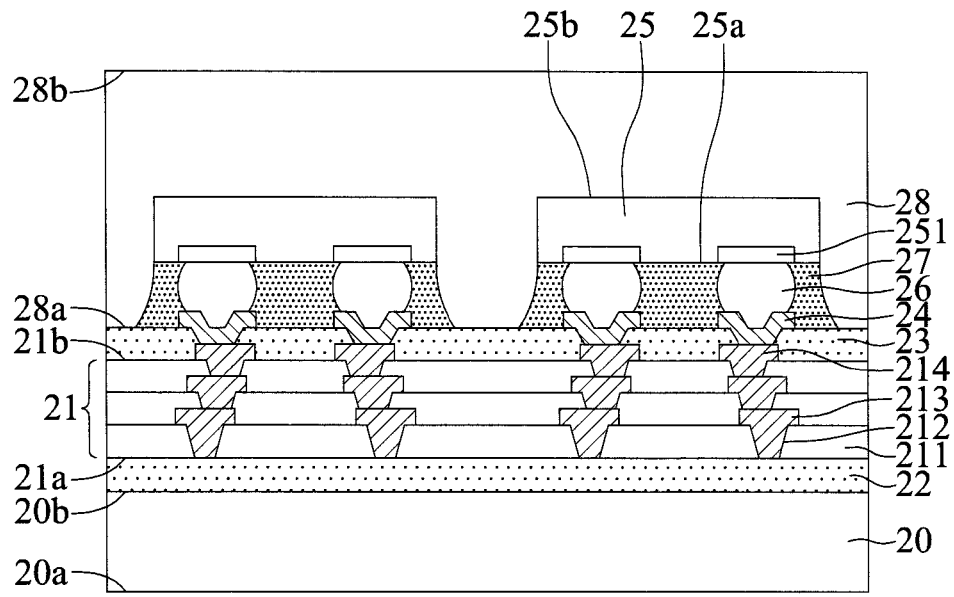
Figure 2E:
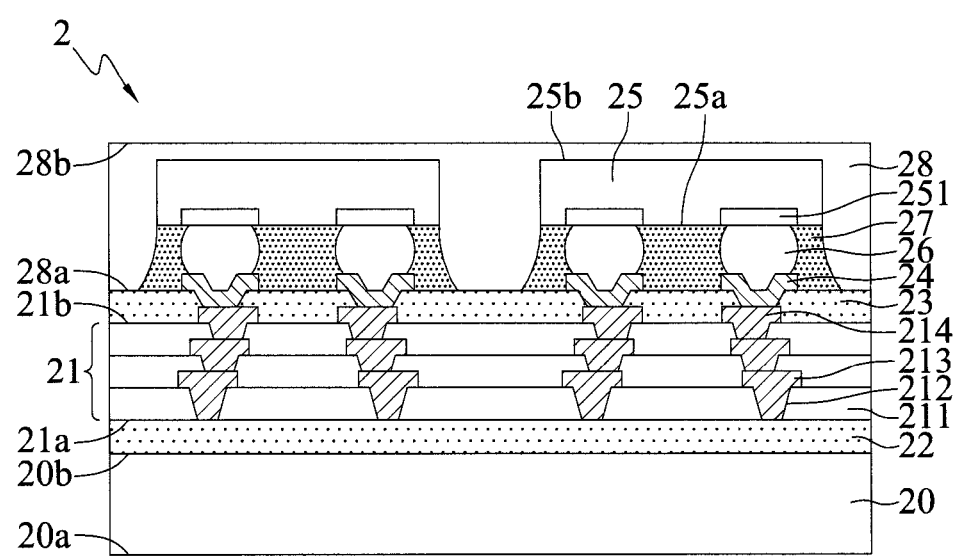
Figure 3A:
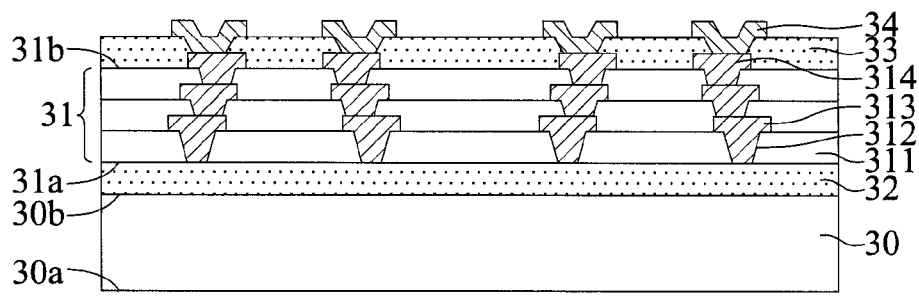
FIGS. 3A to 3I are schematic cross-sectional views showing a semiconductor package and a fabrication method thereof according to a first embodiment of the present invention.

Referring to FIG. 3A, a carrier 30 and a circuit structure 31 are provided. The carrier 30 20 has a first surface 30a and a second surface 30b opposite to the first surface 30a. The circuit structure 31 has a first bottom surface 31a and a first top surface 31b opposite to the first bottom surface 31a. The circuit structure 31 has at least a dielectric layer 311, a plurality of conductive vias 312 formed in the dielectric layer 311, and at least a circuit layer 313 formed on the dielectric layer 311 and electrically connected to the conductive vias 312. Further, the circuit layer 313 has a plurality of first conductive pads 314.

A first insulating layer 32 is formed on the first bottom surface 31a of the circuit structure 31 and a second insulating layer 33 is formed on the first top surface 31b of the circuit structure 31, and the first conductive pads 314 of the circuit structure 31 are exposed from the second insulating layer 33.

The carrier 30 is disposed on the first insulating layer 32 via the second surface 30b thereof, and a UBM layer 34 is formed on the first conductive pads 314.

Figure 3B:
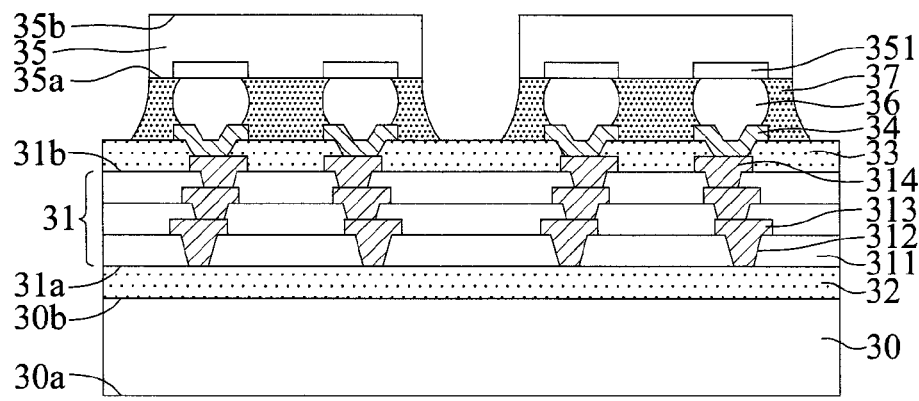

Referring to FIG. 3B, at least a semiconductor element 35 such as a chip is disposed on the second insulating layer 33 and electrically connected to the circuit structure 31. In other embodiments, the second insulating layer 33 can be dispensed with and the semiconductor element 35 is directly disposed on the first top surface 31b of the circuit structure 31.

The semiconductor element 35 has an active surface 35a with a plurality of bonding pads 351 and an inactive surface 35b opposite to the active surface 35a. A plurality of first conductive elements 36 such as solder balls are formed between the bonding pads 351 of the semiconductor elements 35 and the UBM layer 34. As such, the semiconductor element 35 is electrically connected to the first conductive pads 314 of the circuit structure 31 through the first conductive elements 36 and the UBM layer 34.

Then, an underfill 37 is formed between the active surface 35a of the semiconductor element 35 and the second insulating layer 33 to encapsulate the UBM layer 34 and the first conductive elements 36. In the present embodiment, the underfill 37 has two portions correspondingly formed between two semiconductor elements 35 and the second insulating layer 33 and separated from one another. In other embodiments, the underfill 37 between the semiconductor elements 35 and the second insulating layer 33 can be in the form of a single piece. In addition, the underfill 37 can be dispensed with.

Figure 3C:
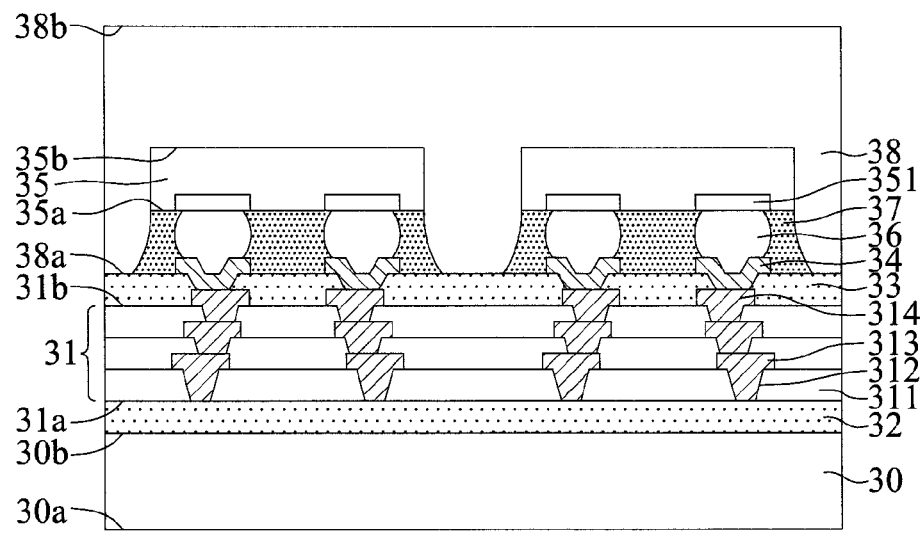

Referring to FIG. 3C, an encapsulant 38 is formed on the second insulating layer 33 to encapsulate the semiconductor element 35 and the underfill 37. The encapsulant 38 has a second bottom surface 38a facing the second insulating layer 33 and a second top surface 38b opposite to the second bottom surface 38a. In other embodiments, the second insulating layer 33 can be dispensed with and the encapsulant 38 is directly formed on the first top surface 31b of the circuit structure 31, and the second bottom surface 38a of the encapsulant 38 faces the first top surface 31b of the circuit structure 31.

Figure 3D:
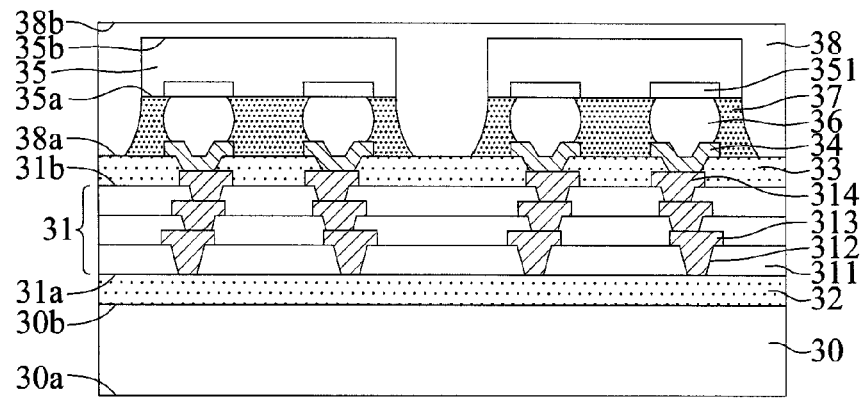

Referring to FIG. 3D, by performing such as a grinding process (for example, mechanical grinding), the encapsulant 38 is thinned from the second top surface 38b to such an extent that the second top surface 38b of the encapsulant 38 is close in position to the inactive surface 35b of the semiconductor element 35. In other embodiments, the encapsulant 38 can be thinned to such an extent that the second top surface 38b of the encapsulant 38 is flush with and exposes the inactive surface 35b of the semiconductor element 35.

Figure 3E:
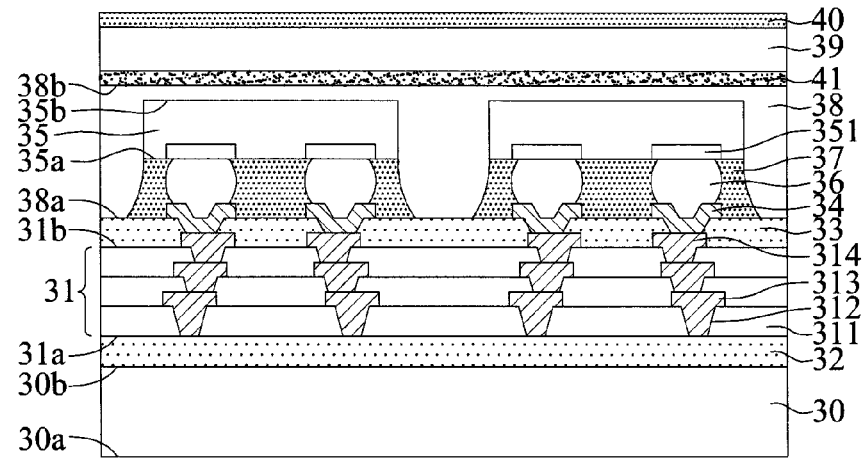

Referring to FIG. 3E, a strengthening layer 39 is formed on the second top surface 38b of the encapsulant 38. The strengthening layer 39 is made of, but not limited to, a semiconductor material, for example, silicon.

In the present embodiment, an insulating layer 40 is further formed on the strengthening layer 39, and an adhesive layer 41 is formed between the second top surface 38b of the encapsulant 38 and the strengthening layer 39.

Figure 3F:
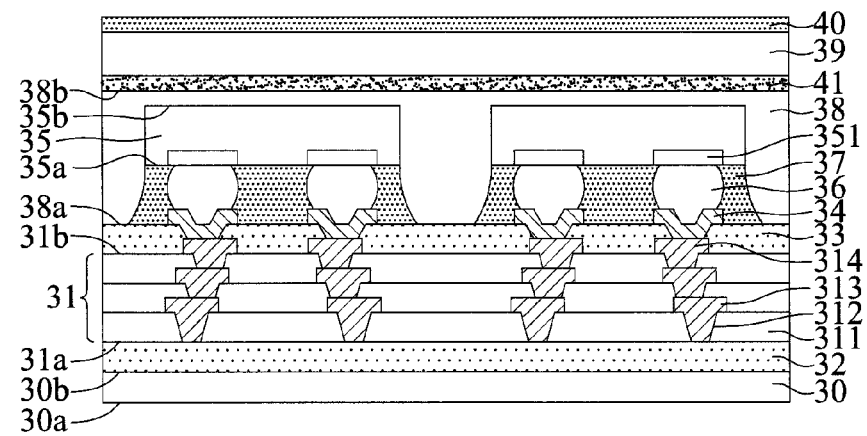

Referring to FIG. 3F, the carrier 30 is thinned from the first surface 30a thereof by such as grinding.

Figure 3G:
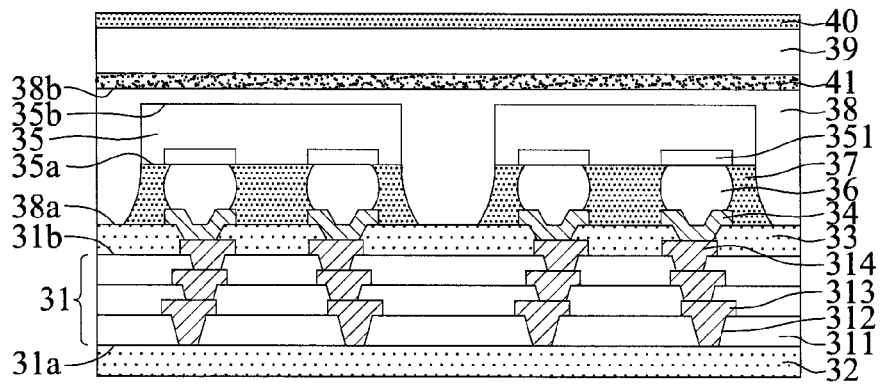

Referring to FIG. 3G the remaining portion of the carrier 30 is removed by such as etching so as to expose the first insulating layer 32. The etching can be, but not limited to, a chemical etching, a wet etching or a reactive ion etching (RIE).

Figure 3H:
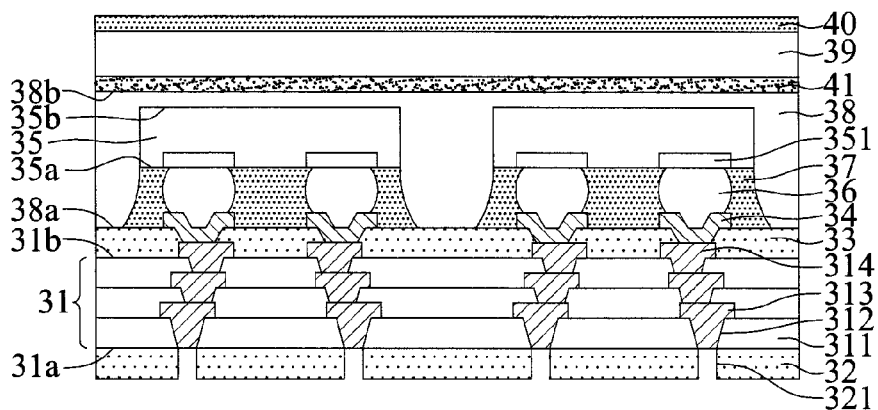

Referring to FIG. 3H, a plurality of first through holes 321 are formed in the first insulating layer 32 to expose the conductive vias 312 of the circuit structure 31.

Figure 3I:
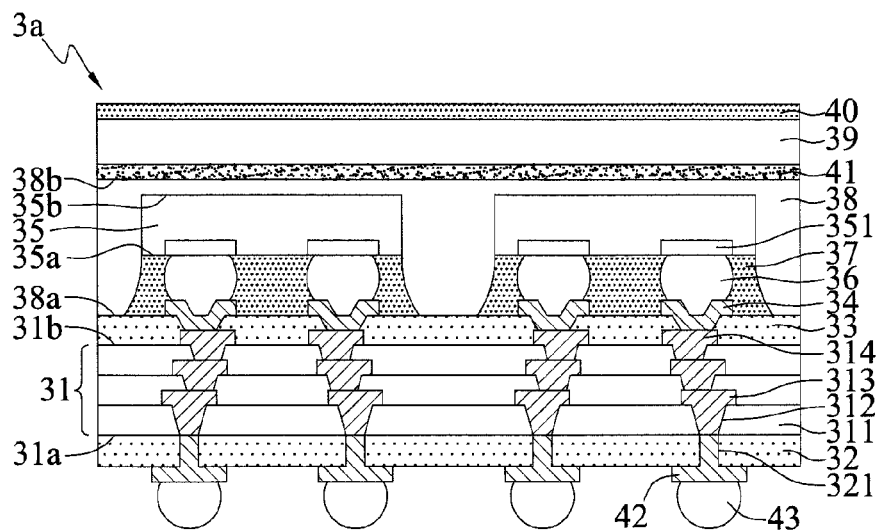

Referring to FIG. 3I, a plurality of second conductive pads 42 are formed on the first insulating layer 32 and in the first through holes 321 and electrically connected to the conductive vias 312 of the circuit structure 31. Then, a plurality of second conductive elements 43 such as solder balls are formed on the second conductive pads 42. As such, a semiconductor package 3a is obtained.

FIGS. 4A to 4I are schematic cross-sectional views showing a semiconductor package 3b and a fabrication method thereof according to a second embodiment of the present invention. The difference of the present embodiment from the first embodiment is described as follows.

Figure 4A:
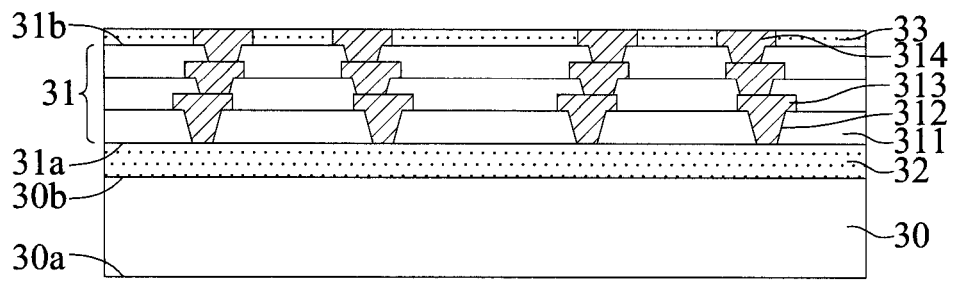
FIGS. 4A to 4I are schematic cross-sectional views showing a semiconductor package and a fabrication method thereof according to a second embodiment of the present invention.

Referring to FIG. 4A, the UBM layer 34 of FIG. 3A is not formed on the first conductive pads 314.

Figure 4B:
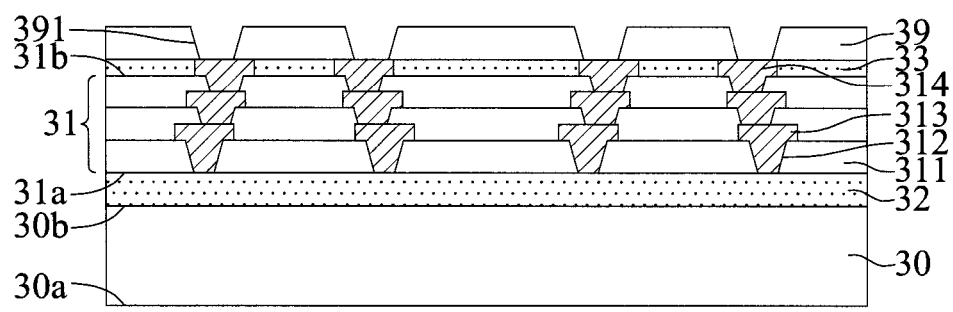

Referring to FIG. 4B, a strengthening layer 39 is formed on the second insulating layer 33. Alternatively, the second insulating layer 33 can be dispensed with and the strengthening layer 39 is directly formed on the first top surface 31b of the circuit structure 31. The strengthening layer 39 has a plurality of openings 391 for exposing the first conductive pads 314. The strengthening layer 39 can be made of an elastic material or a buffer material, for example, polybenzoxazole (PBO), and have a thickness of several tens of micrometers.

Figure 4C:
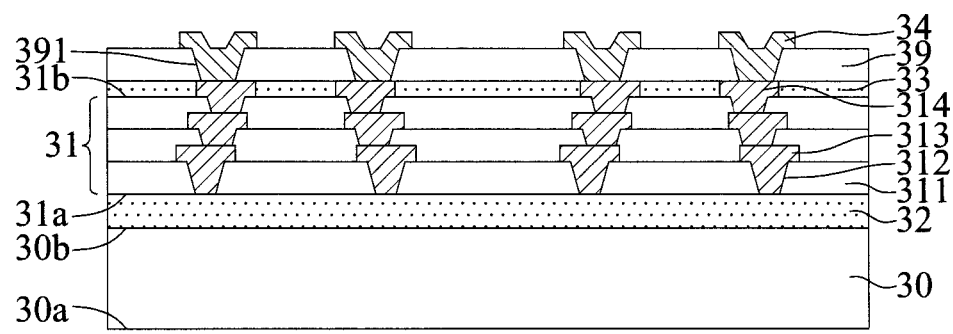

Referring to FIG. 4C, a UBM layer 34 is formed on the strengthening layer 39 and in the openings 391 and electrically connected to the first conductive pads 314.

Figure 4D:
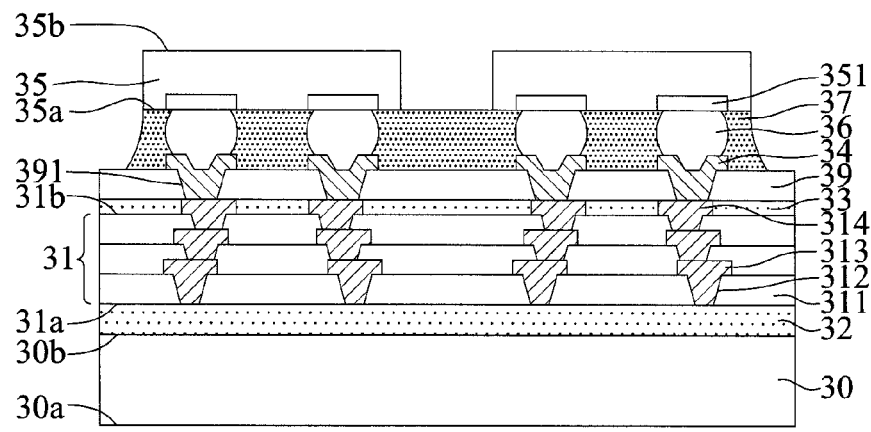

Referring to FIG. 4D, an underfill 37 is formed between the active surfaces 35a of at least two semiconductor elements 35 and the second insulating layer 33 as a single piece.

Figure 4E:
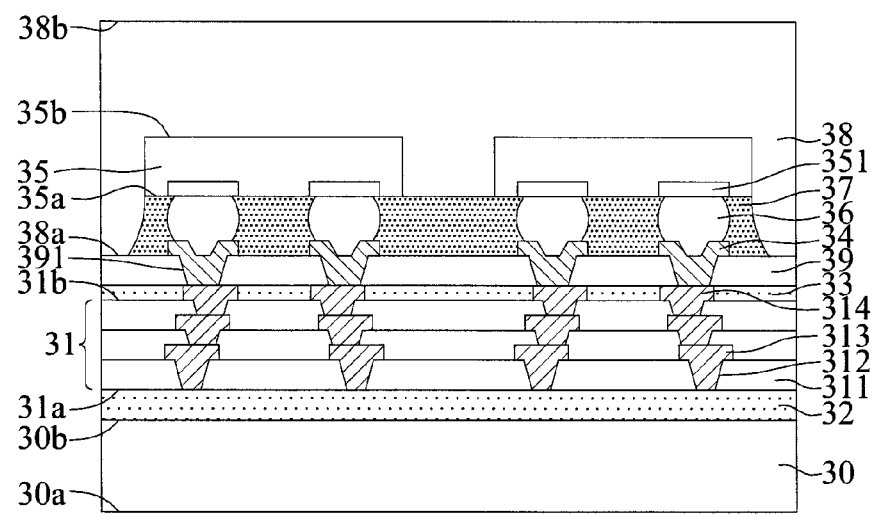

Referring to FIG. 4E, an encapsulant 38 is formed on the strengthening layer 39 to encapsulate the semiconductor elements 35 and the underfill 37. The strengthening layer 39 is positioned between the second insulating layer 33 and the encapsulant 38 (or underfill 37). In other embodiments, the second insulating layer 33 can be dispensed with and hence the strengthening layer 39 is positioned between the circuit structure 31 and the encapsulant 38 (or underfill 37).

Figure 4F:
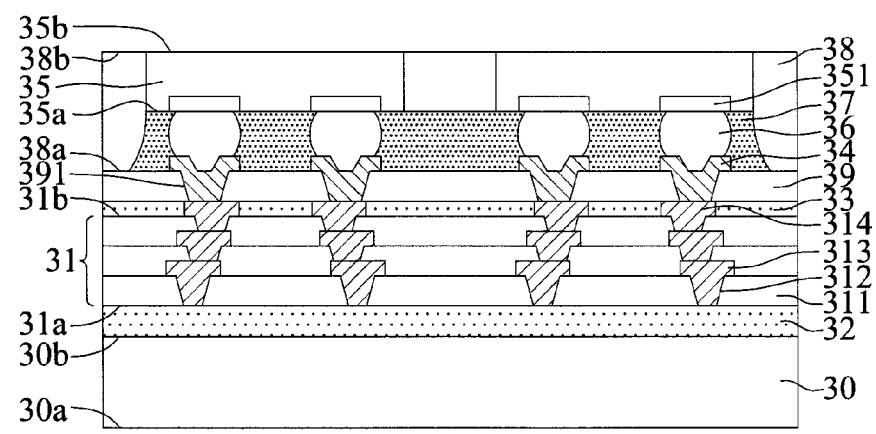
Figure 4G:
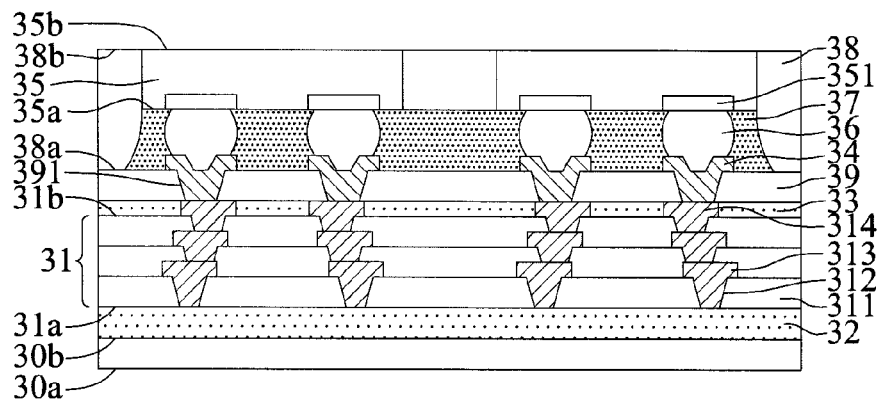
Figure 4H:
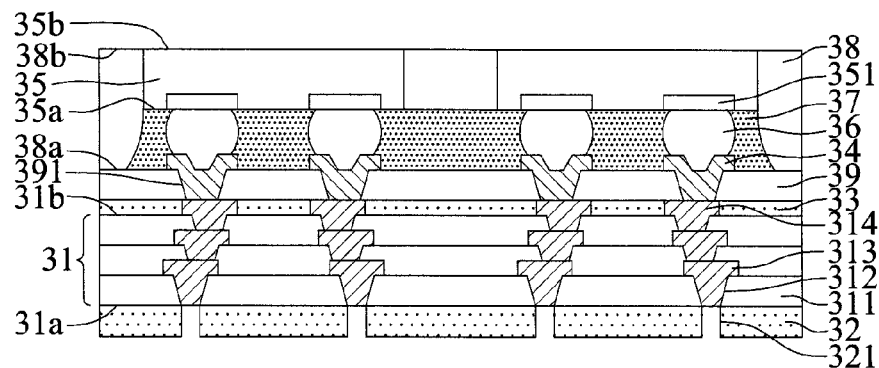

Referring to FIG. 4F, the encapsulant 38 is thinned to expose the inactive surfaces 35b of the semiconductor elements 35, thereby strengthening the heat dissipating effect of the semiconductor elements 35.

FIGS. 5A to 5H are schematic cross-sectional views showing a semiconductor package 3c and a fabrication method thereof according to a third embodiment of the present invention. Therein, FIG. 5D' shows another embodiment of FIG. 5D. The difference of the present embodiment from the first embodiment is described as follows.

Figure 5A:
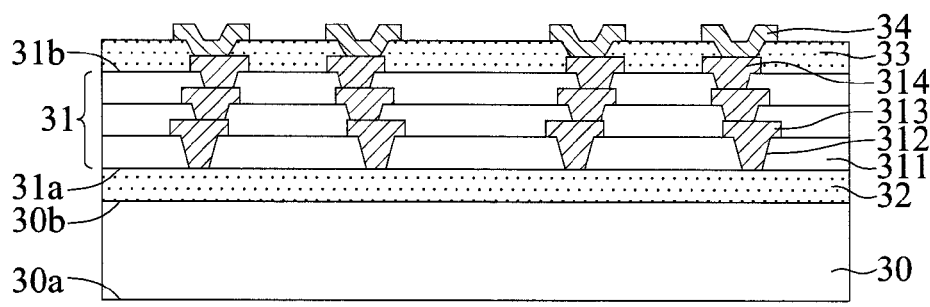
FIGS. 5A to 5H are schematic cross-sectional views showing a semiconductor package and a fabrication method thereof according to a third embodiment of the present invention, wherein FIG. 5D' shows another embodiment of FIG. 5D.
Figure 5B:
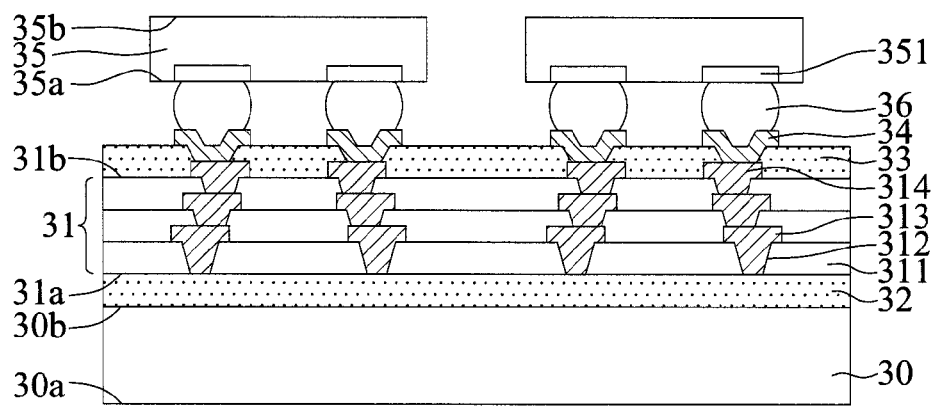

Referring to FIG. 5B, the underfill 37 of FIG. 3B is dispensed with.

Figure 5C:
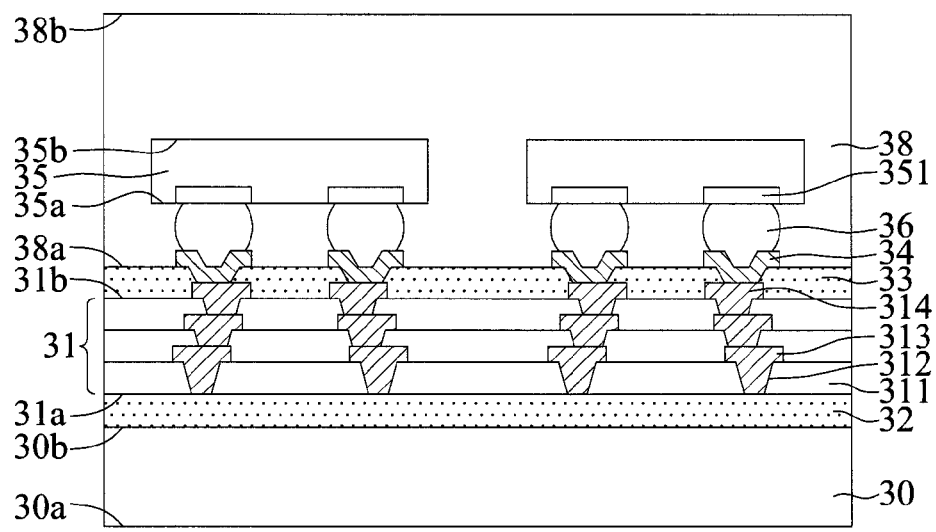

Referring to FIG. 5C, an encapsulant 38 is directly formed between the active surfaces 35a of the semiconductor elements 35 and the second insulating layer 33 to encapsulate the UBM layer 34 and the first conductive elements 36.

Figure 5D:
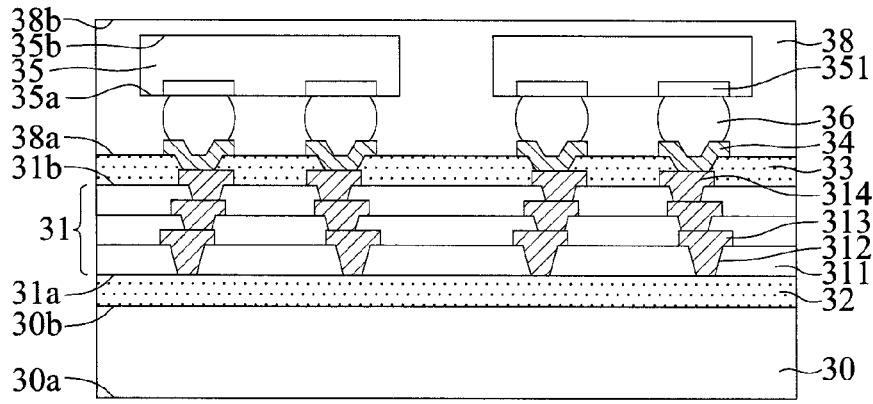
Figure 5D:
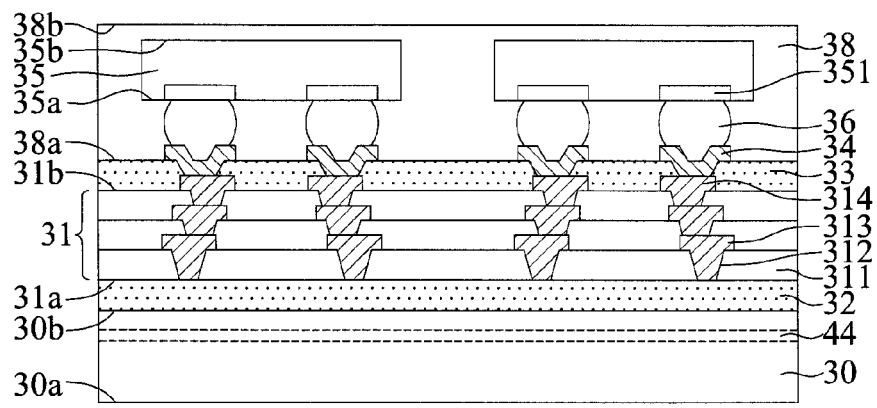
Figure 5E:
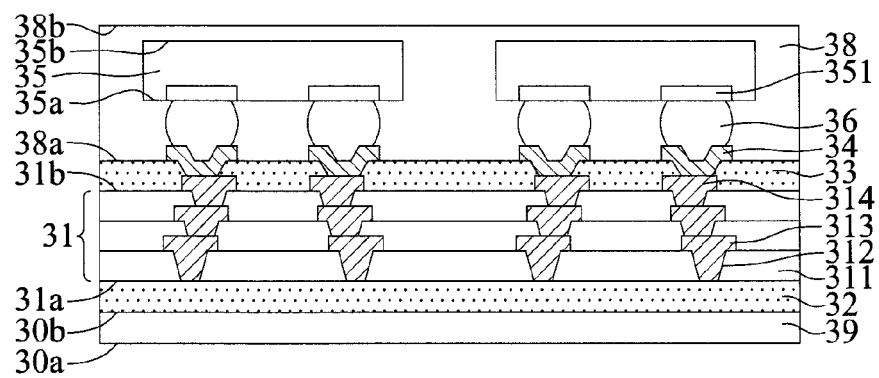

Referring to FIGS. 5D and 5E, after the encapsulant 38 is thinned, the carrier 30 is thinned and the remaining portion of the carrier 30 serves as a strengthening layer 39. As such, the strengthening layer 39 is positioned on the first bottom surface 31a of the circuit structure 31. The strengthening layer 39, i.e. the carrier 30, is made of a semiconductor material such as silicon, and has a thickness of 5 to 20 um.

In particular, fabricating the strengthening layer 39 includes: forming a first insulating layer 32 on the first bottom surface 31a of the circuit structure 31 and disposing a carrier 30 having opposite first and second surfaces 30a, 30b on the first insulating layer 32 (as shown in FIG. 5A); after thinning the encapsulant 38, thinning the carrier 30 from the first surface 30a thereof so as to use the remaining portion of the carrier 30 as the strengthening layer 39 (as shown in FIGS. 5D and 5E).

In an embodiment, referring to FIG. 5D', before the carrier 30 is thinned, an ion implantation process is performed to form an etch stop layer 44 in the carrier 30 at a predetermined depth. As such, the carrier 30 is thinned by etching according to the etch stop layer 44 so as to have a predetermined thickness.

Figure 5F:
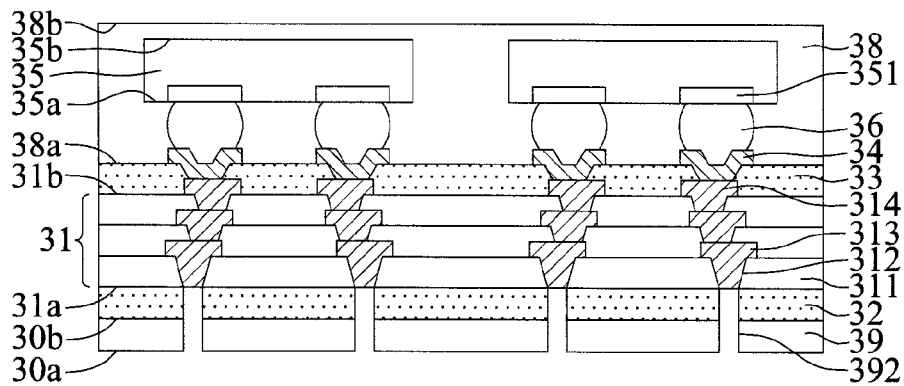

Referring to FIG. 5F, a plurality of second through holes 392 are formed to penetrate the strengthening layer 39 and the first insulating layer 32 and expose the conductive vias 312 of the circuit structure 32.

Figure 5G:
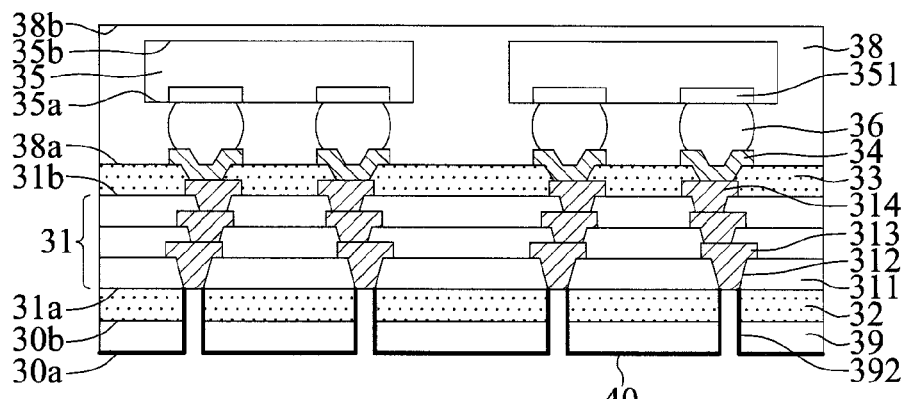

Referring to FIG. 5G an insulating layer 40 is formed on the strengthening layer 39 and wall surfaces of the second through holes 392.

Figure 5H:
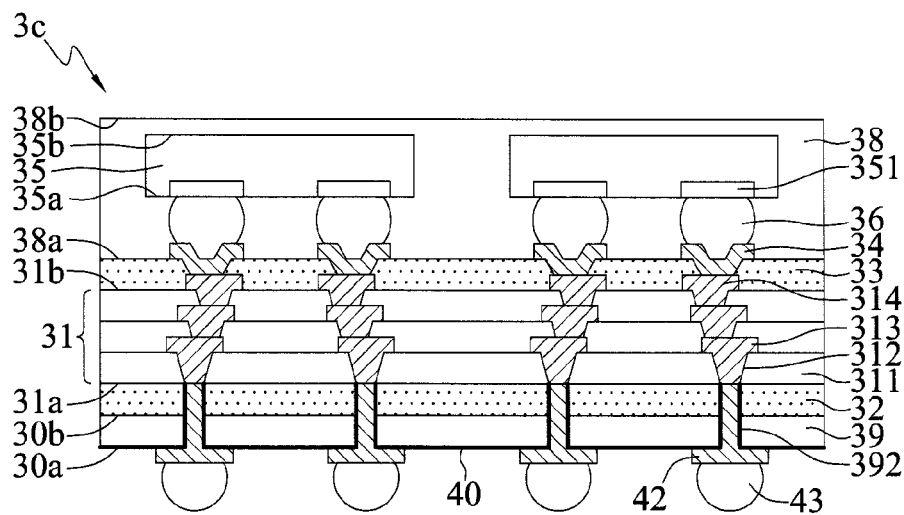

Referring to FIG. 5H, a plurality of second conductive pads 42 are formed on the insulating layer 40 and in the second through holes 392 and electrically connected to the conductive vias 312 of the circuit structure 31. The insulating layer 40 is used to prevent a short circuit or electrical interference from occurring between adjacent second conductive pads 42.

The present invention further provides a semiconductor package 3a, as shown in FIG. 3I. The semiconductor package 3a has: a circuit structure 31 having a first bottom surface 31a and a first top surface 31b opposite to the first bottom surface 31a; at least a semiconductor element 35 such as a chip disposed on the first top surface 31b of the circuit structure 31 and electrically connected to the circuit structure 31; an encapsulant 38 formed on the first top surface 31b of the circuit structure 31 to encapsulate the semiconductor element 35, wherein the encapsulant 38 has a second bottom surface 38a facing the first top surface 31b of the circuit structure 31 and a second top surface 38b opposite to the second bottom surface 38a; and a strengthening layer 39 formed on the second top surface 38b of the encapsulant 38.

The circuit structure 31 can have at least a dielectric layer 311, a plurality of conductive vias 312 formed in the dielectric layer 311, and at least a circuit layer 313 formed on the dielectric layer 311 and electrically connected to the conductive vias 312. The circuit layer 313 has a plurality of first conductive pads 314.

The semiconductor element 35 can have an active surface 35a having a plurality of bonding pads 351 and an inactive surface 35b opposite to the active surface 35a.

The strengthening layer 39 can be made of a semiconductor material such as silicon.

The semiconductor package 3a can further have a first insulating layer 32 formed on the first bottom surface 31a of the circuit structure 31 and having a plurality of first through holes 321 for exposing the conductive vias 312 of the circuit structure 31.

The semiconductor package 3a can further have a plurality of second conductive pads 42 formed on the first insulating layer 32 and in the first through holes 321 and electrically connected to the conductive vias 312 of the circuit structure 31.

The semiconductor package 3a can further have an insulating layer 40 formed on the strengthening layer 39, and an adhesive layer 41 formed between the second top surface 38b of the encapsulant 38 and the strengthening layer 39.

The semiconductor package 3a can further have a UBM layer 34 formed on the first conductive pads 314 of the circuit structure 31, and a plurality of first conductive elements 36 such as solder balls formed between the bonding pads 351 of the semiconductor element 35 and the UBM layer 34. As such, the semiconductor element 35 is electrically connected to the first conductive pads 314 of the circuit structure 31 through the first conductive elements 36 and the UBM layer 34.

The semiconductor package 3a can further have an underfill 37 formed on the active surface 35a of the semiconductor element 35 for encapsulating the UBM layer 34 and the first conductive elements 36. The encapsulant 38 encapsulates the underfill 37.

In the present embodiment, the underfill 37 has two portions correspondingly formed between the two semiconductor elements 35 and the second insulating layer 33 and separated from one another. In other embodiments, the underfill 37 between the two semiconductor elements 35 and the second insulating layer 33 can be in the form of a single piece. In addition, the underfill 37 can be dispensed with.

The semiconductor package 3a can further have a second insulating layer 33 formed on the first top surface 31b of the circuit structure 31 and exposing the first conductive pads 314 of the circuit structure 31.

The semiconductor package 3a can further have a plurality of second conductive elements 43 such as solder balls formed on the second conductive pads 42.

Figure 4I:
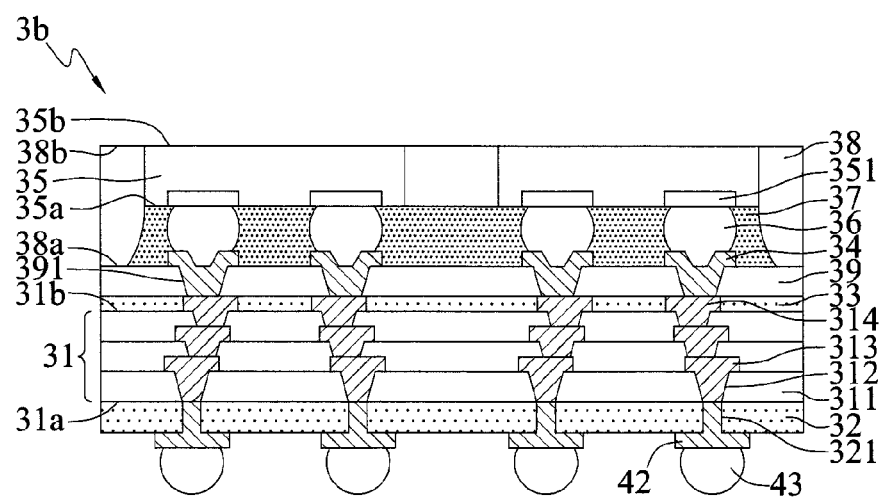

The present invention further provides a semiconductor package 3b, as shown in FIG. 4I. The difference of the semiconductor package 3b from the semiconductor package 3a is described as follows.

Referring to FIG. 4I, the strengthening layer 39 is formed between the second insulating layer 33 and the encapsulant 38 (or underfill 37). Alternatively, the second insulating layer 33 can be dispensed with and the strengthening layer 39 is formed between the first top surface 31b of the circuit structure 31 and the encapsulant 38 (or underfill 37).

The strengthening layer 39 can have a plurality of openings 391 for exposing the first conductive pads 314. The strengthening layer 39 can be made of an elastic material or a buffer material, for example, polybenzoxazole (PBO).

In the present embodiment, the underfill 37 is formed between the at least two semiconductor elements 35 and the second insulating layer 33 as a single piece.

The present invention further provides a semiconductor package 3c, as shown in FIG. 5H. The difference of the semiconductor package 3c from the semiconductor package 3a is described as follows.

Referring to FIG. 5H, the strengthening layer 39 is formed on the first bottom surface 31a of the circuit structure 31. The semiconductor layer 39 can be made of a semiconductor material such as silicon.

The semiconductor package 3c can further have a first insulating layer 32 formed between the first bottom surface 31a of the circuit structure 31 and the strengthening layer 39, and a plurality of second through holes 392 penetrating the strengthening layer 39 and the first insulating layer 32 and exposing the conductive vias 312 of the circuit structure 31.

The semiconductor package 3c can further have an insulating layer 40 formed on the strengthening layer 39 and wall surfaces of the second through holes 392.

The semiconductor package 3c can further have a plurality of second conductive pads 42 formed on the insulating layer 40 and in the second through holes 392 and electrically connected to the conductive vias 312 of the circuit structure 31. The insulating layer 40 can be used to prevent a short circuit or electrical interference from occurring between adjacent second conductive pads 42.

In the present embodiment, the underfill 37 between the semiconductor elements 35 and the second insulating layer 33 can be dispensed with.

According to the present invention, a strengthening layer is formed on the second top surface of the encapsulant, or between the circuit structure and the encapsulant, or on the first bottom surface of the circuit structure. As such, if there is a big CTE mismatch between the encapsulant (or underfill) and the semiconductor element and the encapsulant needs to be thinned, the strengthening layer can alleviate the stress of the encapsulant (or underfill) and effectively reduce warping of the encapsulant and cracking of the semiconductor element, thereby improving the reliability of the semiconductor package.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor package, comprising:
   a circuit structure having a first bottom surface and a first top surface opposite to the first bottom surface;
   at least a semiconductor element disposed on the first top surface of the circuit structure and electrically connected to the circuit structure;
   an encapsulant formed on the first top surface of the circuit structure to encapsulate the semiconductor element, wherein the encapsulant has a second bottom surface facing the first top surface of the circuit structure and a second top surface opposite to the second bottom surface; and
   a strengthening layer formed between the circuit structure and the encapsulant, or formed on the first bottom surface of the circuit structure, wherein the strengthening layer is made of a semiconductor material.

2. The semiconductor package of claim 1, wherein the circuit structure comprises at least a dielectric layer, a plurality of conductive vias formed in the dielectric layer, and at least a circuit layer formed on the dielectric layer and electrically connected to the conductive vias, the circuit layer having a plurality of first conductive pads.

3. The semiconductor package of claim 1, when the strengthening layer is formed between the circuit structure and the encapsulant, further comprising a first insulating layer formed on the first bottom surface of the circuit structure and having a plurality of first through holes for exposing a plurality of conductive vias of the circuit structure.

4. The semiconductor package of claim 3, further comprising a plurality of second conductive pads formed on the first insulating layer and in the first through holes and electrically connected to the conductive vias of the circuit structure.

5. The semiconductor package of claim 1, when the strengthening layer is formed between the circuit structure and the encapsulant, the strengthening layer has a plurality of openings for exposing a plurality of first conductive pads of the circuit structure.

6. The semiconductor package of claim 1, when the strengthening layer is formed on the first bottom surface of the circuit structure, further comprising a first insulating layer formed between the circuit structure and the strengthening layer, and a plurality of second through holes penetrating the strengthening layer and the first insulating layer and exposing a plurality of conductive vias of the circuit structure.

7. The semiconductor package of claim 6, further comprising an insulating layer formed on the strengthening layer and wall surfaces of the second through holes.

8. The semiconductor package of claim 7, further comprising a plurality of second conductive pads formed on the insulating layer and in the second through holes and electrically connected to the conductive vias of the circuit structure.

9. The semiconductor package of claim 1, further comprising a second insulating layer formed on the first top surface of the circuit structure and exposing a plurality of first conductive pads of the circuit structure.

10. The semiconductor package of claim 1, further comprising a UBM layer formed on a plurality of first conductive pads of the circuit structure, and a plurality of conductive elements formed between the semiconductor element and the UBM layer.

11. The semiconductor package of claim 10, further comprising an underfill formed on an active surface of the semiconductor element for encapsulating the UBM layer and the conductive elements.

12. The semiconductor package of claim 1, wherein the semiconductor material is silicon.

* * * * *